United States Patent
Pok et al.

(10) Patent No.: US 9,269,703 B2
(45) Date of Patent: Feb. 23, 2016

(54) ESD PROTECTION USING DIODE-ISOLATED GATE-GROUNDED NMOS WITH DIODE STRING

(71) Applicant: Texas Instruments Incorporated, Dallas, TX (US)

(72) Inventors: Ponnarith Pok, Plano, TX (US); Kyle Schulmeyer, Dallas, TX (US); Roger A. Cline, Plano, TX (US); Charvaka Duvvury, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/453,907

(22) Filed: Aug. 7, 2014

(65) Prior Publication Data

US 2014/0342515 A1    Nov. 20, 2014

Related U.S. Application Data

(62) Division of application No. 13/288,507, filed on Nov. 3, 2011, now Pat. No. 8,829,618.

(60) Provisional application No. 61/409,598, filed on Nov. 3, 2010.

(51) Int. Cl.
*H01L 21/00* (2006.01)
*H01L 27/02* (2006.01)
*H01L 21/8234* (2006.01)
*H01L 27/06* (2006.01)
*H01L 29/66* (2006.01)
*H01L 29/78* (2006.01)

(52) U.S. Cl.
CPC .... *H01L 27/0255* (2013.01); *H01L 21/823481* (2013.01); *H01L 27/0274* (2013.01); *H01L 27/0629* (2013.01); *H01L 29/66136* (2013.01); *H01L 29/78* (2013.01)

(58) Field of Classification Search
CPC .................. H01L 27/0255; H01L 29/661636; H01L 21/823481; H01L 27/0629; H01L 27/0274; H01L 29/78
See application file for complete search history.

(56) References Cited

U.S. PATENT DOCUMENTS

2004/0212936 A1* 10/2004 Salling et al. ................... 361/56
2011/0266624 A1* 11/2011 Duvvury et al. ............... 257/360

OTHER PUBLICATIONS

"The Optimization of Diode Isolated Grounded Gate nMOS for ESD Protection in Advanced CMOS Technologies", Yen-Yi Lin, Vesselin Vassilev, and Charvaka Duvvury, International ESD Workshop, Lake Tahoe CA, May 18, 2009.*

* cited by examiner

*Primary Examiner* — Laura Menz
(74) *Attorney, Agent, or Firm* — Jacqueline J. Garner; Frank D. Cimino

(57) ABSTRACT

An ESD protection circuit with a diode string coupled to a diode-isolated, gate-grounded NMOS ESD device. A method of forming an ESD protection circuit with a diode string coupled to a diode-isolated, gate-grounded NMOS ESD device.

7 Claims, 3 Drawing Sheets

ESD PROTECTION USING DIODE-ISOLATED GATE-GROUNDED NMOS WITH DIODE STRING

CROSS-REFERENCE TO RELATED APPLICATIONS

This application is a divisional of U.S. Nonprovisional patent application Ser. No. 13/288,507, filed Nov. 3, 2011, and claims the priority of U.S. provisional application Ser. No. 61/409,598, filed Nov. 3, 2010. The following co-pending patent application is related and hereby incorporated by reference: U.S. Nonprovisional patent application Ser. No. 12/771,114 (Texas Instruments docket number TI-67675, filed Apr. 30, 2010), the contents of which are herein incorporated in its entirety.

FIELD OF THE INVENTION

This invention relates to the field of integrated circuits. More particularly, this invention relates to an electrostatic discharge (ESD) protection device.

BACKGROUND OF THE INVENTION

Electrostatic discharge (ESD) is a continuing problem in the design, manufacture, and utilization of integrated circuits (ICs). A major source of ESD exposure to ICs is from the human body (described by the "Human Body Model", HBM). In this situation, a packaged IC acquires a charge when it is held by a human who is electrostatically charged (e.g. from walking across a carpet). A charge of about 0.6 uC may be induced on a body capacitance of 100 pF, for example, leading to an electrostatic potential of 4 kV or more and discharge peak currents of several amperes to the IC for approximately 100 ns. A second source of ESD exposure is from charged metallic objects (described by the "Machine Model", MM), which is characterized by a greater capacitance, lower internal resistance and transients that have significantly faster rise times and higher peak current levels than a HBM ESD source. A third source of ESD exposure is due to the discharge of stored charge on the integrated circuit itself (described by the "Charged Device Model", CDM), to ground with rise times of less than 500 ps. The current flow during CDM is in the opposite direction than from the HBM and MM ESD sources. Thus, an ESD device must provide protection from discharges both to and from the IC.

During an ESD event, ESD current is typically discharged between one or more of the IC pins and another object such as a human body, a metal object, or ground. When ESD current flows through vulnerable circuitry in the IC, the circuitry may be destroyed. Many conventional ESD protection techniques employ peripheral circuits to carry the ESD currents from the pins of the IC to ground by providing a low impedance path that bypasses more vulnerable circuits in the IC chip. In this way the ESD currents flow through the protection circuitry rather than through the more vulnerable circuits in the chip.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An ESD protection circuit with a diode string coupled to a diode-isolated, gate-grounded NMOS ESD device. A method of forming an ESD protection circuit with a diode string coupled to a diode-isolated, gate-grounded NMOS ESD device.

DETAILED DESCRIPTION OF EXAMPLE EMBODIMENTS

Figure 1:
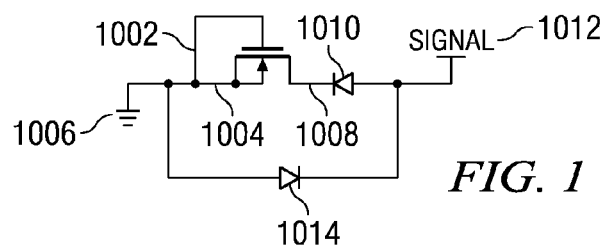
FIG. 1 is a circuit diagram of a diode-isolated, gate-grounded NMOS ESD device.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 2:
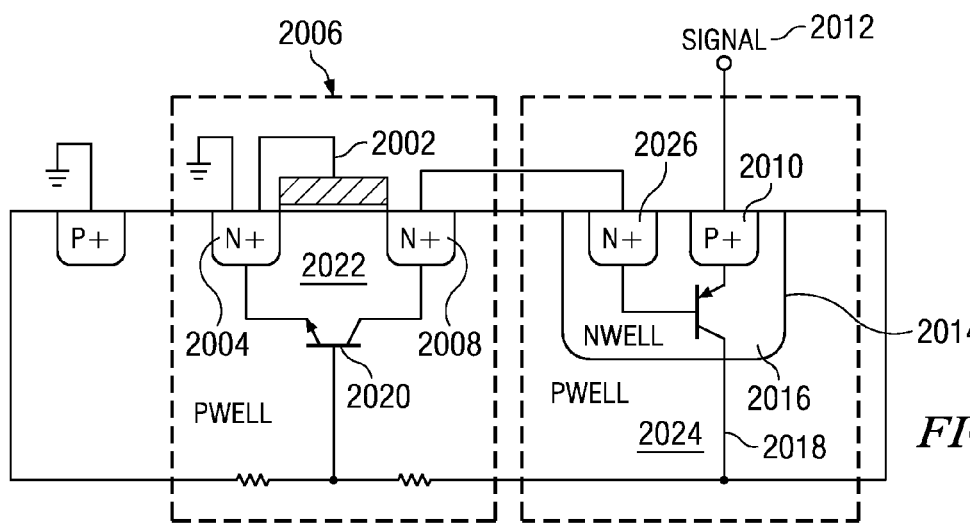
FIG. 2 is a cross sectional illustration of a diode-isolated, gate-grounded NMOS ESD device.

FIGS. 1 and 2 illustrate a diode isolated, gate-grounded NMOS ESD device (DIGGNMOS) that is described in copending U.S. patent application Ser. No. 12/771,114 (Texas Instruments docket number TI-67675, filed Apr. 30, 2010).

In the circuit diagram of FIG. 1, the nmos transistor gate 1002 is connected to the source 1004, which in turn is connected to ground 1006. The drain 1008 is isolated from the signal pin 1012 through reverse biased diode 1010. Reverse biased diode 1014 is in parallel with the diode isolated, gate grounded nmos transistor 1002.

The operation of this ESD device may be explained using FIG. 2. An npn bipolar transistor 2020 is formed with the source (emitter) 2004, body (base) 2022, and drain (collector) 2008, of the gate grounded nmos transistor (GGNMOS)

2002. A pnp, bipolar transistor 2018 is formed with the p+ junction (collector) 2010, the nwell (base) 2016, and the pwell 2024. During an ESD strike to signal pin 1012, the ESD current passes through forward biased diode 1010 until it is blocked by the reverse biased diode, 1008 of the GGNMOS 1002 drain. Except for diode leakage current, no current flows until the reverse biased drain junction 1008 breaks down. During an ESD strike to signal pin 2012 the voltage may continue to rise until diode breakdown of the reverse biased drain 2008, $V_{BD}$, is reached. After this point, as the voltage on the signal pin 2012 continues to rise, the p+/nwell junction 2010 becomes forward biased causing the vertical pnp bipolar 2018 to turn on pumping large amounts of current into the pwell 2024. The rising voltage of the pwell may forward bias the emitter 2004 base 2022 junction of the lateral npn bipolar 2020, turning it on. With npn bipolar 2020 turned on, large amounts of ESD current may be conducted through forward biased diode 2010 and bipolar 2022 to ground 2004, thus protecting the more vulnerable integrated circuits.

Figure 3:
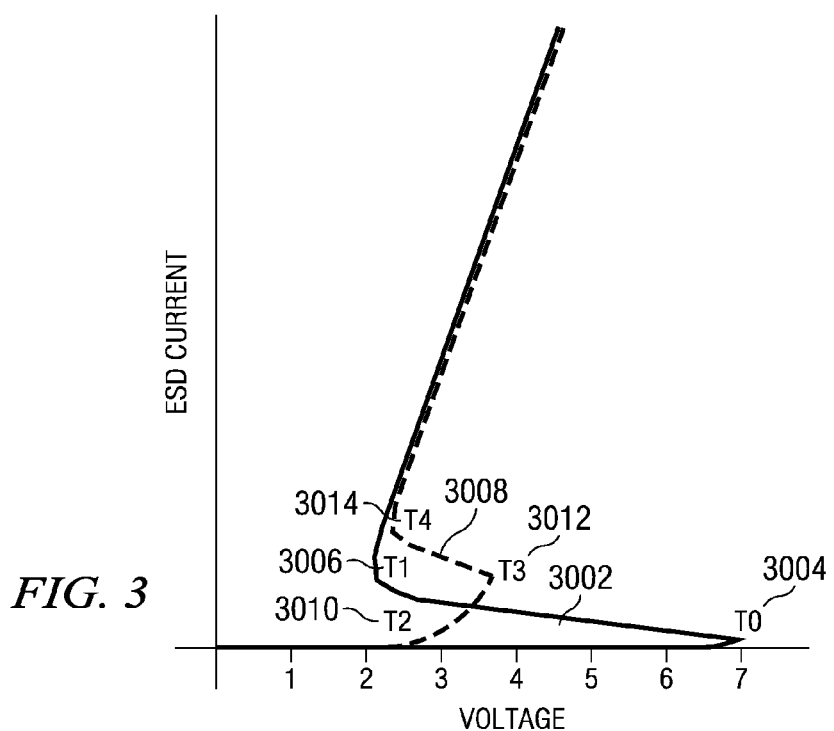
FIG. 3 is a graph of the current voltage characteristics of a diode-isolated, gate-grounded NMOS ESD device and an ESD device according to an embodiment of the invention.

A graph illustrating the current flow of the device in FIG. 1 during an ESD event is shown by the solid curve, 3002, in FIG. 3. At the beginning of an ESD event, the voltage on signal pin 2012, begins to rise rapidly without much current flow until the diode breakdown voltage of the drain diffusion 2008 of the GGNMOS transistor 2002 is reached at point T0 3004 in the graph in FIG. 3. The reverse diode breakdown voltage may be approximately 7 volts. The current then begins to rise and the voltage begins to drop as vertical bipolar 2024 turns on injecting current into the pwell base 2022 of lateral npn bipolar 2020. When lateral bipolar 2020 turns on at point T1 3006, the ESD current rapidly rises as the lateral bipolar 2020 conducts current in series with forward biased isolation diode 2010 from the signal pad 2012 to ground 2004.

Figure 4:
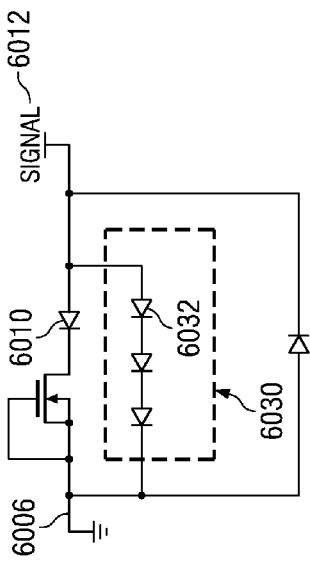
FIG. 4 is a circuit diagram of a diode-string enhanced diode-isolated, gate-grounded NMOS ESD device according to an embodiment of the invention.
Figure 5:
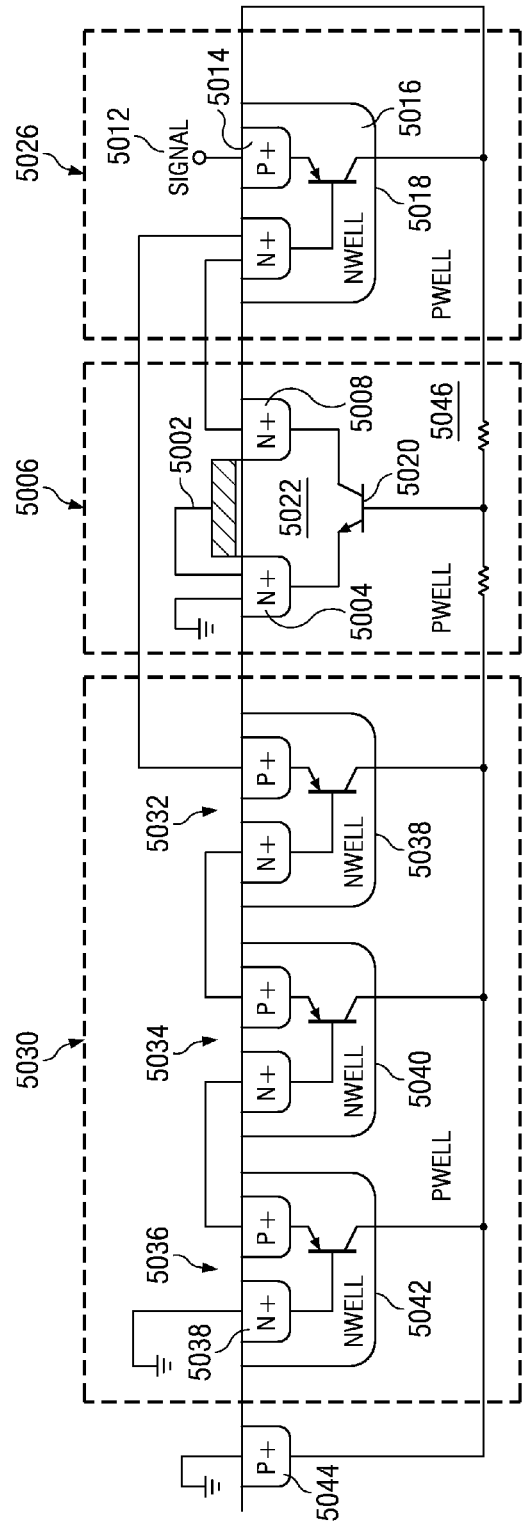
FIG. 5 is a cross sectional illustration of a diode-string enhanced, diode-isolated, gate-grounded NMOS ESD device formed according to an embodiment of the invention.

An improved diode-isolated gate-grounded ESD device according to an embodiment of the instant invention with a faster turn on is shown in FIGS. 4 and 5.

A forward biased diode chain 4030 is added to a DIGGN-MOS ESD device as shown in circuit diagram in FIG. 4. The diode string 4030 is in parallel with the GGNMOS transistor 4002 and is connected between the GGNMOS drain 4008 and ground 4006. The number of diodes that are connected in series is determined by voltage requirements of the integrated circuit (IC). For example, each diode has an offset voltage of approximately 0.7 volts that must be overcome before forward biased conduction begins. Three diodes in series must be forward biased with approximately 2.1 volts before current starts to flow.

The operation of this improved embodiment ESD protection circuit during an ESD event may be explained using the cross section in FIG. 5. During an ESD strike, there is no initial current flow through the forward biased isolation diode 5026 until the voltage rises to where the offset turn on trigger voltage of the diode string 5030 is reached at which point forward biased current begins to flow. In the example embodiment of a diode chain 5030 with three forward biased diodes, the forward biased current may begin to flow at approximately 2.8 volts corresponding to a total of four diodes in series including the diode 4010. (point T2 in FIG. 3).

As the voltage continues to rise on signal pad 5012, the pn diode 5014 in the isolation diode 5026 becomes forward biased turning on the vertical pnp bipolar transistor 5018. (point T3 in FIG. 3) This injects current into the pwell 5040 and into the base 5022 of the lateral npn bipolar transistor 5020. In addition, the voltage on the pn junctions 5032, 5034, and 5036 in diode chain 5030 also become forward biased turning on vertical pnp bipolar transistors 5038, 5040, and 5042 pumping additional current into the pwell 5046 and the base of lateral npn bipolar transistor 5020. (Region between points T3 and T4 in FIG. 3). When sufficient current has been pumped into the base 5022 of lateral npn bipolar transistor 5006, it turns on conducting ESD current in parallel with the forward biased isolation diode 5026 from the signal pad 5012 to ground 5004.

The diode chain 5030 reduces time to turn on the lateral npn bipolar transistor 5002 by reducing the voltage at which the vertical pnp bipolar transistors 5018, 5038, 5040, and 5042 turn on and also by increasing the rise time of the potential of the lateral bipolar base 5020 with current from diode string 5030, vertical pnp bipolar transistors 5018, 5038, 5040, and 5042. The faster turn on time of lateral bipolar transistor 5020 may add additional protection to the more vulnerable circuits on the chip by conducting the ESD current from signal pad 5012 to ground 5004 before it may harm the integrated circuit.

Figure 6:
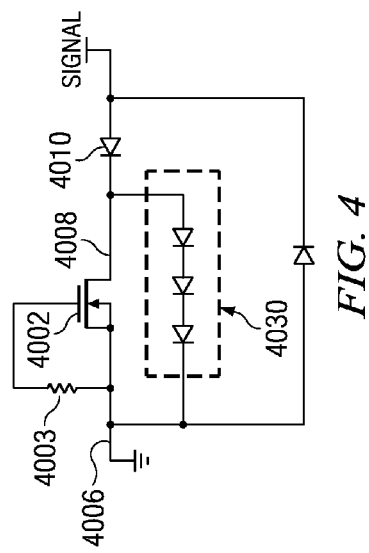
FIG. 6 is a circuit diagram of a diode-string enhanced diode-isolated, gate-grounded NMOS ESD device according to an embodiment of the invention.

Another embodiment according to the instant invention is illustrated in FIG. 6. In this embodiment, diode string 6030 is placed between the signal pad 6012 and ground 6006. Although the diode string 6030 provides a benefit, the benefit may not be as great as adding a diode string connected as in FIG. 4. Since in the embodiment shown in FIG. 6, the vertical bipolar transistors of isolation diode 6010, and diode string 6030, diode 6032, are in parallel, it may take longer to turn on these parallel bipolar transistors than it takes to turn on diode 4010 in FIG. 4 which is in series with the diode chain 4030 bipolar transistors.

In the above embodiments, GGNMOS is a NMOS transistor. This NMOS transistor may be any of a variety of NMOS transistor types including a core nmos transistor, an I/O nmos transistor, or a drain extended NMOS transistor (DENMOS).

Layout of these diodes with respect to the DIGGNMOS has a significant impact upon the efficiency of the ESD device. Carriers injected into pwell 5040 will be less effective at turning on lateral npn bipolar 5020, if they are injected far from the body 5022. These diodes 5032, 5034, and 5036, may be placed in close proximity to the DIGGNMOS body 5022 to cause the body potential to rise faster thus reducing the turn on time of the lateral npn bipolar transistor 5006.

Figure 7:
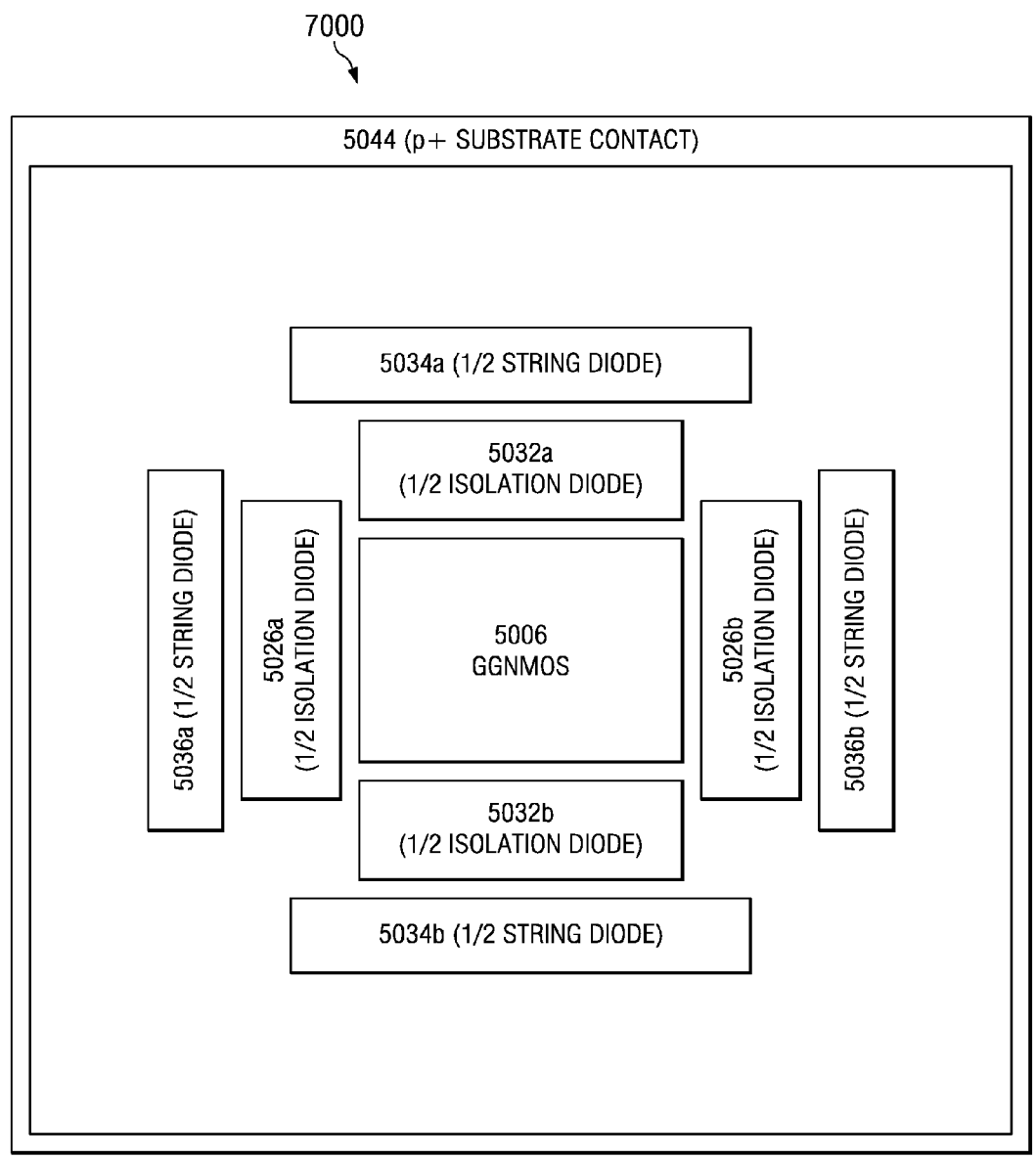
FIG. 7 is an example layout of a diode-string enhanced, diode-isolated, gate-grounded NMOS ESD device according to an embodiment of the invention.

An example layout is shown in FIG. 7. The numbered labels in FIG. 7 correspond to the structures in FIG. 5. GGN-MOS transistor 5006 is laid out in the center of the ESD circuit structure 7000. Isolation diode 5026 is divided into 2 sections, 5026a and 5026b, which are placed in close proximity to the body of GGNMOS 5006 to improve the injection of carriers into the body 5022 of the lateral bipolar 5020. Likewise, the diodes in the diode string 5032, 5034, and 5036 are divided into two sections and are placed in close proximity to the body of the GGNMOS 5006 to additionally facilitate the injection of carriers into the base 5022 of the lateral npn bipolar 5020 which is under the GGNMOS transistor 5006. The p+ substrate contact diffusion 5044 is located a distance from the body 5022 of the GGNMOS transistor to reduce its efficiency at removing injected carriers from the body. In an example embodiment, the distance between the GGNMOS transistor 5006 and the p+ substrate contact diffusion 5044 may be between approximately 5 microns and 20 microns.

The layout in FIG. 7 is to illustrate an embodiment of the instant invention and is not intended to be limiting. Other layouts of the diode-isolated GGNMOS ESD device with other segmentations of the diodes and other layouts of the diodes with respect to the GGNMOS 5006 are possible.

The embodiment of FIG. 4 may include other variations where the gate of the NMOS 4002 is tied to ground 4006 through an optional resistor 4003 for additional improvement in trigger efficiency.

The embodiment in FIG. 5 may include other variations of the diodes which may include "gated diodes" where a gate is placed over the anode and cathode of the diodes.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising:
    forming a gate-grounded NMOS ESD device;
    forming an isolation diode in series with and coupled to a source of the gate-grounded NMOS transistor, wherein the isolation diode is segmented and placed in close proximity to, and on opposite sides of, a body of the gate-grounded NMOS ESD device; and
    forming a diode string coupled to the gate-grounded NMOS ESD device in a forward biased configuration, wherein diodes of the diode string are segmented and placed on multiple sides of the body of the gate-grounded NMOS ESD device.

2. The method of claim 1 where said diode string is formed with at least 2 diodes in series.

3. The method of claim 2 where said diode string is formed with 3 diodes in series.

4. The method of claim 1 further comprising coupling said diode string between a drain and a source of said gate-grounded NMOS ESD device.

5. The method of claim 1 further comprising coupling said diode string between a source of said gate-grounded NMOS ESD device and a p+ diffusion of the isolation diode in said gate-grounded NMOS ESD device.

6. The method of claim 1 where a p+ substrate contact diffusion surrounds said gate-grounded NMOS ESD device and said diode string.

7. The method of claim 1 further comprising coupling a gate of said gate-grounded NMOS ESD device to ground through a resistor.

* * * * *